United States Patent [19]

Sanders et al.

[11] Patent Number: 4,842,981

[45] Date of Patent: * Jun. 27, 1989

[54] IMAGING SYSTEM

[75] Inventors: Frederick W. Sanders; Gary F. Hillenbrand; Jonathan S. Arney; Richard F. Wright, all of Chillicothe, Ohio

[73] Assignee: The Mead Corporation, Dayton, Ohio

[*] Notice: The portion of the term of this patent subsequent to Aug. 16, 2000 has been disclaimed.

[21] Appl. No.: 613,548

[22] Filed: May 24, 1984

Related U.S. Application Data

[63] Continuation of Ser. No. 562,308, Dec. 16, 1983, Continuation of Ser. No. 320,643, Nov. 12, 1981, Pat. No. 4,440,846.

[51] Int. Cl.$^4$ .................. G03C 1/68; G03C 5/16; B41L 1/20; B32B 5/16
[52] U.S. Cl. .................. 430/138; 430/211; 430/345; 430/162; 430/235; 428/402.2; 428/402.22; 428/402.24; 503/225
[58] Field of Search ............ 430/138, 211, 345, 962, 430/235; 428/402.2, 402.22, 402.24; 282/27.5

[56] References Cited

U.S. PATENT DOCUMENTS

| | | | |
|---|---|---|---|
| 3,202,510 | 8/1965 | Hollmann | 430/138 |
| 3,219,446 | 11/1965 | Berman | 430/138 |
| 3,892,569 | 7/1975 | Speers | 430/138 X |
| 4,110,511 | 8/1978 | Lee et al. | 430/138 X |

FOREIGN PATENT DOCUMENTS

1141475  3/1985  United Kingdom ............ 430/138

Primary Examiner—Paul R. Michl
Assistant Examiner—Cynthia Hamilton
Attorney, Agent, or Firm—Smith & Schnacke

[57] ABSTRACT

An imaging system in which images are formed by image-wise exposing a layer containing a chromogenic material and a photosensitive composition in which at least the photosensitive composition is encapsulated in a layer of pressure rupturable capsules. Exposure and capsule rupture renders the chromogenic material image-wise accessible to the developer for a patterned image forming reaction.

17 Claims, 1 Drawing Sheet

IMAGING SYSTEM

CROSS REFERENCE TO RELATED APPLICATIONS

This application is a continuation of U.S. Application Ser. No. 562,308, filed Dec. 16, 1983, which in turn is a continuation of U.S. Application Ser. No. 320,643, filed Nov. 12, 1981, now U.S. Pat. No. 4,440,846.

BACKGROUND OF THE INVENTION

The present invention relates to an imaging system and more particularly to an office based system which is suitable for making photocopies. In accordance with the invention, images are formed by image-wise exposing of a photosensitive encapsulate containing a chromogenic material to actinic radiation and rupturing the capsules in the presence of a developer whereby a patterned reaction of the chromogenic material and developer is obtained which produces a contrasting image.

Imaging systems based on photosensitive encapsulates are known. Berman, U.S. Pat. No. 3,219,446 discloses a transfer imaging process in which azo-blue-"B" black dye is encapsulated with a cross-linkable polymer or a polymerizable monomer as a fluid-droplet containing film or a fluid droplet containing microcapsules. As described, the Berman imaging system is a transfer system which relies upon selectively transferring the encapsulated dye to a copy sheet in correspondence with the image. Imaging is accomplished by image-wise exposing a layer of the encapsulate to electromagnetic radiation to cross-link the polymer, causing the liquid in the exposed capsules to assume a rigid condition and not transfer to a copy sheet. Dye transfer is limited to the unexposed areas of the encapsulate-containing layer.

Phillips, U.S. Pat. No. 3,700,439 discloses a photocopy process wherein Michler's ketone is encapsulated in a conventional manner and provided as a layer on a support. Michler's ketone itself is not a color former, but patterned irradition of the ketone containing capsules produces a latent image of colorless, acid-colorable, dye precursor from the ketone such that upon contact with an acid developer such as acid clay a visible image is obtained. Phillips discloses both a system wherein the exposed imaging sheet is calendered face-to-face with an acid-coated receiving sheet to form images and a system wherein the acid developer is on the same surface as the capsule coating so that after rupturing the capsules on the imaging sheet there is development without transfer.

Berman et al, U.S. Pat. No. 3,072,481 discloses another type of encapsulated light sensitive element which utilizes a light-sensitive material which is readily converted to a colored form when carried in a liquid vehicle but which is insensitive to light when solid. By encapsulating such a material with a volatile solvent, image-wise exposing a layer of the encapsulate and rupturing the capsules to evaporate the solvent, an image is obtained and fixed.

Forris, U.S. Pat. No. 3,001,873, discloses a more complex system wherein the walls of capsules containing a solid dye are photosensitized such that patterned exposure renders the capsules unswellable. By wetting the sheet to swell the unexposed capsules and heating, the dye is immobilized in the unexposed areas. Thereafter, by rupturing the capsules in contact with a receiving sheet there is an image-wise transfer of the dye from the exposed areas only.

While image-forming techniques such as these have been known, for various reasons, they have not matured into commercial photocopy systems. Furthermore, the potential of these systems to afford a low cost imaging system has not been realized.

SUMMARY OF THE INVENTION

Thus, a principal object of the present invention is to provide an imaging system in which images are formed by image-wise exposing a photosensitive encapsulate to actinic radiation and rupturing the capsules in the presence of a developer such that there is a patterned reaction of a chromogenic material, contained in the encapsulate or co-deposited on a support with the encapsulate, and the developer which yields an image of the original.

Another object of the present invention is to provide an imaging system based on a photosensitive encapsulate which provides images with high resolution and good tonal qualities.

Still another object of the present invention is to provide a dry photocopy system which is affordable and does not require expensive and sophisticated machinery for exposure and processing.

A more specific object of the present invention is to provide an imaging system which is useful in transmission and reflection imaging and hence can be utilized in photocopying printed documents and other materials.

Another object of the present invention is to provide an imaging sheet carrying a photosensitive encapsulate for use in the aforementioned system wherein the encapsulate comprises a chromogenic material and a photosensitive composition.

A still other object of the present invention is to provide a microcapsule which encapsulates a chromogenic material and photosensitive composition.

A further object of the present invention is to provide a so-called self-contained imaging sheet wherein the developer and the photosensitive encapsulate are carried on a single substrate.

Another more particular object of the present invention is to provide an imaging paper which is sensitive to blue light (380–480 nm), and which incorporates a fugitive yellow dye such that said system can be handled in room light for sufficiently short periods of time to load said paper in an exposure apparatus.

A still further object of the present invention is to provide an imaging process wherein images are formed by exposing a layer of a photosensitive encapsulate containing a chromogenic material to actinic radiation, and rupturing the capsule in the presence of a developer.

These and other objects are attained in the present invention which relates to an imaging system basically having:
   a substrate,
   a chromogenic material,
   a photosensitive composition,
   a coating containing said chromogenic material and said photosensitive composition on one surface of the substrate, and
   a developer material which is capable of reacting with the chromogenic material to form a visible image, wherein said photosensitive composition is encapsulated in a pressure rupturable capsule as an internal phase.

Herein, the term "encapsulated" refers to both so-called resin dispersion or open phase systems in which the internal phase containing the photosensitive composition and optionally the chromogenic material is dispersed as droplets throughout a dispersing medium and systems in which the capsule is formed with a discrete capsular wall, the latter encapsulation typically being in the form of microcapsules. "Pressure rupturable capsules" are, accordingly, considered to exist in either of these "encapsulated" systems. Furthermore, while the capsules are described as being "pressure rupturable" other means than pressure may be used to rupture them.

In accordance with the present invention images are formed by exposing the coated composition containing the chromogenic material and the encapsulated photosensitive composition to actinic radiation and rupturing the capsules in the presence of a developer. The invention system is designed such that when these steps are carried out, the image-forming reaction between the chromogenic material and the developer discriminately occurs in the exposed or unexposed areas and produces a detectable image. This is accomplished image-wise by photochemically controlling the access between the chromogenic material and the developer such that a patterned reaction occurs. By "image-wise" it is meant that the reaction between the chromogenic material and the developer occur according to the exposure such that a positive or negative image is obtained. The image may be formed by a change in color or a difference in contrast.

In accordance with the principal embodiment of the invention, the chromogenic material is encapsulated with the photosensitive composition. In general the photosensitive composition can be described as having a viscosity which changes upon exposure to actinic radiation such that upon exposure there is a change in the viscosity of the internal phase in the exposed areas which image-wise determines whether the chromogenic material is accessible to the developer. The photosensitive composition may be a radiation curable composition in which are, upon exposure to light, it increases in viscosity and immobilizes the chromogenic material, thereby preventing it from reacting with the developer material entirely or in proportion to the tonal depth of the image in the exposed areas. [The term "curable" as used herein is not limited to materials which are cross-linked, but is open to materials which are simply polymerized.] In another case the chromogenic material may be encapsulated with a substance which is depolymerized or otherwise decreased in molecular weight upon exposure, resulting in a decrease in viscosity which renders the chromogenic material mobile and accessible to the developer in the exposed areas upon capsule rupture.

It will be evident that in the former case the system is a positive working system, whereas in the latter case it is a negative-working system. Using a radiation curable material, the internal phase containing the chromogenic material is rendered inaccessible to the developer in the exposed areas, thereby preventing the formation of a visible image in those areas. In the unexposed areas, which in reflection imaging correspond to the printed areas of printed documents, the internal phase remains liquid and the chromogenic material can react with the developer to form a positive image. In a negative-working system the chromogenic material containing encapsulate is viscous and upon exposure it liquefies and is rendered reactable with the developer. Thus, in this system, exposure renders the chromogenic material accessible to the developer.

The chromogenic material is not necessarily encapsulated with the photosensitive composition although this is a preferred means for carrying out the present invention. The chromogenic material may be co-deposited on the supporting substrated with the encapsulated photosensitive composition or contained in the capsular wall such that upon capsule rupture the chromogenic material is dissolved and carried to the developer material in a discriminate manner. Hence the photosensitive composition may be encapsulated with a solvent for the chromogenic material or the unpolymerized monomer may dissolve the chromogenic material such that as a result of the exposure the access between the developer and the chromogenic material is controlled as described herein.

It should be apparent that the system does not necessarily require a given capsule to completely release or completely retain its chromogenic encapsulate as long as there is a difference in the amount of chromogenic material transferring or migrating to the developer in the exposed versus the unexposed areas. Indeed, the invention produces images having tonal quality superior to that obtained in most conventional photocopy systems. One reason for the tonal quality of the images obtained in accordance with the invention is that the amount of chromogenic material released from a given area of a microcapsule coated sheet depends on the degree of exposure of the internal phase of the microcapsules in that area. Furthermore, it is not clear whether the amount of chromogenic material transferred is determined by a differential capsule rupture (image versus non-image areas) in the invention. Under one theory all of the capsules (in both exposed and unexposed areas) are uniformly ruptured and they release chromogenic material in proportion to the viscosity of the internal phase in that area or at that point of the image. Another theory for the tonal range is that the images are formed by a matrix of ruptured and unruptured capsules. In actuality, a combination of both theories may occur. Regardless of the theory, upon exposure of the photosensitive encapsulate there is patterned release or immobilization of the encapsulate which it has been found corresponds to the degree of exposure such that tonal gradation is obtained.

The imaging system of the present invention can be made sensitive to various forms of radiation, and as such, the term "actinic radiation" as used herein includes the full spectra of electromagnetic radiation including ultraviolet, infrared, the entire visible spectrum, as well as X-ray and ion beam radiation. The preferred forms of actinic radiation are ultraviolet radiation and visible light having a wavelength of 190 to 800 nm and a most preferred range of 380 to 480 nm (blue).

Ultraviolet sensitive systems are desirable because they can be handled in room light for sufficiently long periods of time to permit the photosensitive material to be removed from the light-shielding packaging in which it is stored and installed in an exposure apparatus without incorporating auxiliary shielding elements into the imaging sheet. The disadvantage to ultraviolet sensitivity is that many documents are printed on papers which include optical brighteners or $TiO_2$ which absorb ultraviolet radiation and, therefore, it is difficult to use ultraviolet radiation to make copies of such documents by reflection imaging.

Blue light sensitivity is advantageous because it avoids the optical brightener problem and it is a simple matter to build temporary screening means into the system for room light handleability.

Where the imaging system is sensitive to blue or visible light, the imaging sheet may be constructed with means to temporarily shield the system from visible light to permit room-light handleability. For example, when the imaging system is sensitive to blue light having a wavelength of 380 to 480 nm, imaging sheets may be constructed with a filter layer which incorporates a fugitive yellow dye. The shielding effect of the dye need not be complete, it is sufficient if the imaging sheet can be handled in room light for only the short period of time required to install it in the exposure apparatus. Once installed in the exposure apparatus, the fugitive dye is deactivated, for example, by thermal bleaching, so that the system can be exposed by blue light irradiation in the exposure apparatus. Room light handleability can also be achieved by controlling the sensitivity level of the composition such that exposure to room light of short duration does not interfere with image formation which is accomplished using more intense radiation.

The imaging system of the present invention may be embodied in a self-contained or autogenic copy sheet in which the encapsulated chromogenic material and the developer material are co-deposited on one surface of a single substrate as one layer or as two contiguous layers, or in a transfer system in which the developer material is coated on a separate substrate as a separate developer or copy sheet. The latter system is the subject of commonly assigned U.S. application Ser. No. 339,917, attorneys Docket MDX 002 P2 filed on even date herewith in the names of the same inventors. Both systems operate by photographic control of the access between the chromogenic material and the developer as previously described. In the self-contained imaging system, following capsule rupture, the chromogenic material and the developer are able to react to form a visible image in the exposed or the unexposed areas (depending on the nature of the viscosity change produced by exposure). Gradual development of the visible image is observed following exposure and capsule rupture as the chromogenic material and developer migrate, mix and react on the face of the sheet.

The transfer system, on the other hand, operates by selective transfer of the chromogenic material from a transfer or imaging sheet to a developer or copy sheet containing the developer material. Depending on the nature of the photosensitive system encapsulated with the chromogenic material, the chromogenic material migrates from the exposed or unexposed areas to the developer sheet where it reacts with the developer and forms a visible image. For example, where a radiation curable material such as trimethylol propane triacrylate together with a photoinitiator, constitute the photosensitive composition, upon exposure the triacrylate is polymerized into a viscous mass. Thus, in the exposed areas the chromogenic material is sufficiently immobilized that in the contact time allotted it cannot transfer to the developer sheet and form color by reaction with the developer material. In the unexposed areas, which correspond to the image, the internal phase remains liquid such that the chromogenic material can be transferred to the developer sheet where it reacts with the developer and forms a positive image.

In the most typical embodiment, capsule rupture is effected by the application of pressure to the imaging sheet alone (in the case of a self-contained system) or in contact with a developer sheet (in a transfer system). Alternative means of capsule rupture can also be used. For example, systems, are envisioned in which the capsules are ruptured ultrasonically, thermally, or by solvent. As previously noted, the invention is applicable to open phase systems as well as systems involving a discrete capsular wall and the method of rupture may depend on the system employed, thermal rupture being a more likely means in conjunction with an open phase system.

Various materials can be used as the chromogenic material and the developer material in the present invention. In this regard, many of the materials conventionally employed in so-called carbonless paper are also suitable for use in the present invention. In the most typical case, the chromogenic material is an electron donating compound and the developer is an electron accepting compound. Preferably, in their unreacted state, these materials are colorless or they are non-absorbing as to the exposure radiation. It is possible to interchange the chromogenic material and the developer using an electron accepting compound in conjunction with the photosensitive composition in the internal phase and using an electron donating compound as the developer material. In most cases the chromogenic material is a dye precursor and preferably a black dye precursor, although a variety of other color precursors are also disclosed below for use in the invention.

In the preferred case, the internal phase contains a radiation curable material. The radiation curable materials used in one embodiment of the invention are preferably free radical addition polymerizable materials. Preferred materials are ethylenically unsaturated compounds and, more particularly, compounds having two or more ethylenically unsaturated terminal groups.

The imaging system of the present invention is quite versatile. It is useful in making copies from printed documents, duplicating blue prints and other line drawings, among other utilities. The invention system can be used to produce monochromatic copies in black or any other color. Some of its principal advantages are the superior tonal quality of the images that are obtained and the fact that imaging can be accomplished using a fairly simple exposure apparatus.

DETAILED DESCRIPTION OF THE INVENTION

Figure 1:
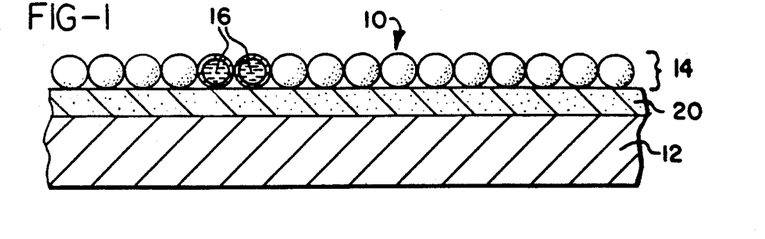
FIG. 1 is a schematic illustration in cross-section of a self-contained imaging sheet constructed in accordance with invention.
Figure 2:
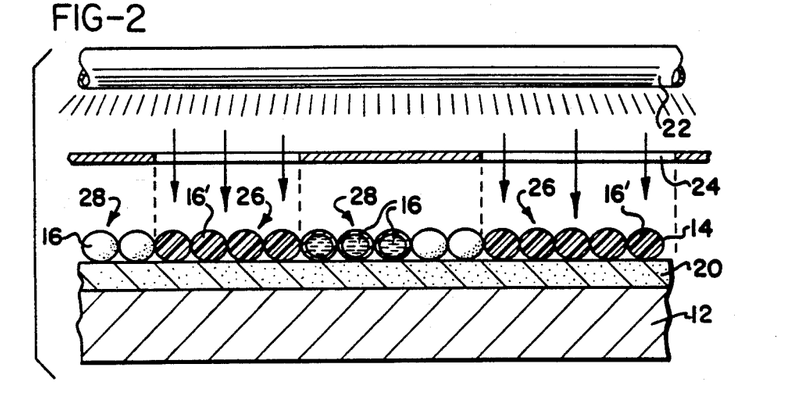
FIG. 2 is a schematic illustration of exposure and development of the imaging sheet.

FIG. 1 illustrates one embodiment of the imaging system of the present invention. Therein a self-contained imaging sheet 10 is shown. The imaging sheet 10 is constituted by a substrate 12 coated with a layer of microcapsules 14. The microcapsules are filled with an internal phase 16 containing a chromogenic material and a photosensitive system. Interposed between the layer of microcapsules 14 and the substrate 12 is a layer of a developer material 20. In actuality, the microcapsules 14 are not visible to the unaided eye. Exposure of the imaging sheet 10 by transmission imaging is shown in FIG. 2 wherein a source of radiant energy 22 is positioned above the surface of the imaging sheet 10 with a mask 24 therebetween. In this illustration the photosensitive material is designated a resin curable material and, hence, the imaging sheet is positive working. Exposure is shown as solidifying the internal phase 16' in the exposed areas 26 whereas the internal phase 16 remains liquid in the unexposed areas 28. Transmission imaging has been selected to illustrate the invention system's operation for the ease with which it can be illustrated. An equally common exposure means is reflection imaging which is used in copying printed documents.

Figure 3:
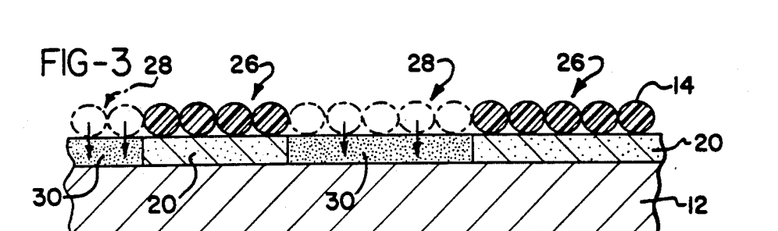
FIG. 3 is a schematic illustration of the developed sheet.

FIG. 3 illustrates the imaging sheet 10 after the microcapsules have been ruptured. For simplification, the microcapsules are shown as being ruptured in the unexposed area 28 and unruptured in the exposed area 26. In actuality all or a portion of the capsules may also be rupture in area 26. In unexposed areas 28 the chromogenic material and the developer react to form a visible image 30.

The operational center of the imaging system of the present invention is the encapsulate or internal phase of the coating composition and optionally a chromogenic material. In accordance with the invention, the internal phase comprises a photosensitive composition. Typically, the photosensitive composition includes a photoinitiator and a substance which undergoes a change in viscosity upon exposure to light in the presence of the photoinitiator. That substance may be a monomer, dimer, or oligomer which is polymerized to a higher molecular weight compound or it may be a polymer which is cross-linked. Alternatively it may be a compound which is depolymerized or otherwise decomposed upon exposure.

In the most typical case, the photosensitive composition includes a radiation curable material. The radiation curable materials useful in the practice of the present invention are preferably materials curable by free radical initiated chain propagated addition polymerization or ionic polymerization. Substantially any photopolymerizable composition which can be encapsulated and which does not interfere with the image-forming capability of the chromogenic material can be used. These materials may be inherently sensitive to the actinic radiation, in which case they may be hardened without a photoinitiator but usually they are materials which are curable in the presence of a photoinitiator. Furthermore, while in the most typical case, the radiation-curable materials undergo an increase in viscosity as a result of polymerization, they may also be oligomers, prepolymers, or polymers which undergo cross-linking upon exposure. In addition to free radical polymerizable materials they may also be materials which are polymerized or cross-linked ionically, e.g., by generation of a Lewis acid.

Representative radiation curable materials are ethylenically unsaturated organic compounds. These compounds contain at least one terminal ethylenic group per molecule. Typically they are liquid and can also double as a carrier oil for the chromogenic material in the internal phase.

A preferred group of radiation curable materials is ethylenically unsaturated compounds having two or more terminal ethylenic groups per molecule. Representative examples of these compounds include ethylenically unsaturated acid esters of polyhydric alcohols such as trimethylol propane triacrylate.

Another preferred radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483.

Isocyanate modified acrylate, methacrylic and itaconic acid esters of polyhydric alcohols as disclosed in U.S. Pat. Nos. 3,783,151; 3,759,809 and 3,825,479 all to Carlick et al which are specifically incorporated by reference, are also useful. Radiation curable compositions based on these isocyanate modified esters and including reactive diluents such as tetraethylene glycol diacrylate as well as photoinitiators such as chlorinated resins, chlorinated paraffins and amine photoinitiation synergists are commercially available as overprint varnishes from Sun Chemical Corporation, Carlstat, N.J., under the trade name of Suncure resins.

Another class of curable materials useful in the present invention are found in radiation curable inks as the photosensitive component such as a mixture of a pentaerythritol acrylate and halogenated aromatic, alicyclic or aliphatic photoinitiator as disclosed in U.S. Pat. No. 3,661,614 to Bessemir et al, which is also incorporated by reference. Another type radiation curable material is halogenated resins which can be cross-linked up exposure, to ultraviolet radiation.

Some typical examples of radiation de-polymerizable materials useful in other embodiments of the invention are 3-oximino-2-butanone methacrylate which undergoes main chain scission upon ultraviolet exposure and poly (4'-alkyl acylo-phenones. See Reichmanis, E.; *Am. Chem. Soc. Div. Org. Coat. Plast. Chem. Prepr.* 1980, 43, 243–251 and Lukac, I.; Chmela S., Int. Conf. on Modif. Polym. 5th Bratislava, Czech, July 3–6, I.U.P.A.C. Oxford, England, 1979, 1, 176–182.

The radiation curable or depolymerizable material usually makes up the majority of the internal phase. A radiation curable material must be present in an amount sufficient to immobilize the chromogenic material upon exposure. With a depolymerizable material, on the other hand, the internal phase must be constituted such that the chromogenic material is immobilized prior to exposure but is released after exposure and capsule rupture. Typically these materials constitute 40 to 99 wt % of the internal phase (based on the weight of the oil solution containing the chromogen, the photosensitive composition and the carrier oil when present). In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

Those skilled in the art will appreciate that various photoinitiators can be selected for use in the present invention depending on the sensitivity that is desired in accordance with the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers.

The following compounds may be useful as photoinitiators in the present invention:

α-alkoxyphenyl ketones of the formula I where $R^1$ is a C(1-4) alkyl group (e.g., methyl, ethyl, n-propyl, i-propyl, t-butyl, etc.), $R^2$ is a phenyl group or a substituted phenyl group wherein said substituent is as defined for X below, $R^3$ is hydrogen or a C(1-4) alkyl group, and X is hydrogen, an alkoxy group having 1 to 4 carbon atoms (e.g., methoxy, ethoxy, propyloxy, etc.), a dialkylamino group wherein said alkyl group contains 1 to 4 carbon atoms, a nitro group, a nitroso group, a cyano group, a mercapto group, chlorine, bromine or iodine, an alkyl group having 1 to 4 carbon atoms, an alkenyl group having 1 to 4 carbon atoms, an acyl group, a phenyl group, or a carboalkoxy group having 2 to 5 carbon atoms;

an α, α, dialkoxyphenyl ketone of the formula II where $R^1$, $R^2$ and X are defined as in formula I;
1-phenyl-1,2-propanedione-2-O-benzoyloxime,
9,10-phenanthraquinone,
9,10-anthraquinone,
a benzophenone of the formula III where X' is hydrogen, an amino group, or a dialkylamino group, the alkyl group having 1 to 4 carbon atoms, and Y is hydrogen, an alkyl group having 1 to 4 carbon atoms, an alkoxy group having 1 to 4 carbon atoms, an alkenyl group having 1 to 4 carbon atoms, a phenyl group a substituted phenyl group, a dialkylamino group, a nitro group, a nitroso group, a cyano group, a mercapto group, chlorine, bromine, iodine, or an acyl group;

xanthone, a chloroxanthone, a chloromethyl xanthone, a chlorosulfonyl xanthone,
thioxanthone, a chlorothioxanthone, a chloromethyl thioxanthone, a chlorosulfonyl thioxanthone,
chloromethylnaphthalene,
chlorosulfonyl naphthalene,
chloromethyl anthracene,
chlorosulfonyl anthracene,
chloromethyl benzoxazole,
chloromethyl benzothiazole,
chloromethyl benzimidazole,
chlorosulfonyl benzoxazole,
chlorosulfonyl benzothiazole,
chlorosulfonyl benzimidazole,
a chloromethyl quinoline,
a chlorosulfonyl quinoline,
a chloromethyl benzophenone,
a chlorosulfonyl benzophenone,
a chloromethyl fluorenone,
a chlorosulfonyl fluorenone,
carbon tetrabromide,
benzoin methyl ether,
benzoin ethyl ether,
desyl chloride,
desyl amine,
methylene blue/ascorbic acid,
chlorinated aliphatic hydrocarbons and
combinations thereof.

The sensitivity among these compounds can be shifted by adding substituents such that the compounds generate radicals when exposed to the desired radiation wavelength. For visible (blue) light sensitivity, the aforementioned photoinitiators may be combined with a sensitizer such as Michler's ketone or an anologous dialkylamino benzophenone thereof, a substituted coumarin, a linear polyene (e.g., trans B-carotene) or a sensitizing dye, e.g., a yellow dye.

For ultraviolet sensitivity a preferred photoinitiator-sensitizer is a combination of Michler's ketone and benzoin methyl ether (preferred ratio 2:5).

The photoinitiator is present in the internal phase in an amount sufficient to initiate polymerization or crosslinking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition. Those skilled in the art can readily determine amounts suitable for the desired exposure properties. An instantaneous system would be desirable, i.e., one which will provide an image with less than 0.5 to 1 second exposure, however, exposure time ranging from 0.5 to up to 1 minute are sometimes required. The actual exposure time will depend on a number of variables such as coat weight, coat thickness, the radiation curable substance (rate of photopolymerization), the type and source of radiation, the radiation intensity and its distance from the sheet.

It is also possible to reduce the exposure time by incorporating a scattering agent in the capsule layer. A scattering agent increases the means free path and thereby intensifies exposure. One such scattering agent that can be used in the present invention is magnesium oxide.

The chromogenic materials used in the present invention are preferably oil soluble color formers which will produce a color upon reaction with a developer material in the presence of a carrier oil. Substantially any of the chromogenic materials conventionally used in carbonless paper can be used in the present invention. In general, these materials are colorless electron donating type compounds. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spriobi(benzo-f-chrome), 3,3-bis(p-dimethylaminophenyl)phthalide, 3-(p-dimethylaminophenyl)-3-(1,2-dimethylindole-3-yl)phthalide, 3-(p-dimethylaminophenyl)-3-(2-methylindole-3-yl)phthalide, 3-(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl)6-dimethylaminophthalide, 3,3bis-(9-ethylcarbazole-3-yl)-5-dimethylaminophthalide, 3,3-bis(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Rhodamine-(p-nitroanilino)lactam, Rhodamine-B-(p-chloroanilino)lactam, 3-dimethylamino-6-methoxyfluoran, 3-dimethylamino-7-methoxyfluoran, 3-dimethylamino-7-chloro-6-methylfluroan, 3-dimethylamino-6-methyl-7-anilinofluoran, 3-dimethylamino-7-(acetylmethylamino)fluoran, 3-dimethylamino-7-(dibenzylamino)fluoran, 3-dimethylamino-7-(methylbenzylamino)fluoran, 3-dimethylamino-7-(chloroethylmethylamino)fluoran, 3-dimethylamino-7-(diethylamino)-fluoran, 3-methyl-spiro-dinaphthopyran, 3-ethyl-spiro-dinaphthopryan, 3,3'-dichloro-spiro-dinaphthopyran, 3-benzyl-spiro-dinaphthoypyran, 3-methyl-naphtho-(3-methoxybenzo)-spirpyran, 3-propyl-spirodibenzoidipyran, etc.

Mixtures of these color precursors can be used if desired. Also useful in the present invention are the fluoran color formers disclosed in U.S. Pat. No. 3,920,510, which is incorporated by reference.

The present invention, however, is not limited to the use of the aforementioned color precursors as chromogenic materials. In addition, organic chemicals which are capable of reacting with heavy metal salts to give colored metal complexes, chelates or salts can be adapted for use in this invention.

Substantially any color forming material which can be encapsulated and which will react with a developer material to form an image can be used in the present invention. Furthermore, it is not necessary to maintain the conventional distinction between color formers and color developers in the invention system. That is, in some embodiments, the chromogenic material may be what is commonly referred to as a color developer provided the so called color developer does not absorb in the exposure radiation range so as to interfere with successful imaging.

In addition to the chromogenic material and the photosensitive material, the internal phase of the present invention may also include a carrier oil. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, castor oil, mineral oil, deodorized kerosense, naphthenic mineral oils, dibutyl phthalate, brominated paraffin, dibutyl fumerate, and mixtures thereof. Alkylated biphenyls are generally less toxic and preferred.

The presence of a carrier oil affects and can be used to control the tonal quality of the images obtained. While tonal quality (half-tone gradation) is not critical when copying printed documents, it is an important factor in faithfully reproducing pictoral images. Initial studies show that where trimethylol propane triacrylate is used in the radiation curable material, 20% of a carrier oil such as brominated paraffin improves tonal qualities.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer. One means of preventing undesired coloration in a self-contained sheet is to reduce the amount of the chromogenic material in the internal phase. Another means is to incorporate color suppressants with the chromogenic material.

Typically a transfer imaging sheet contains 6 percent chromogenic material in the internal phase whereas self-contained imaging sheets have been formed using 1.5 to 3 percent of chromogenic material.

As indicated above, the imaging systems of the present invention may be formulated such that they are sensitive to any of ultraviolet, infrared, X-ray, ion beam, and visible radiation. For room light handleability, ultraviolet sensitive imaging systems are preferred. Ultraviolet sensitive imaging systems are suitable for recording images from a cathode ray tube as well as in reproducing images from a transparent or translucent photomask. Both of these systems rely upon transmitted ultraviolet radiation to expose the imaging system. It has been found, however, that ultraviolet sensitivity is generally not suitable when it is desired to reproduce a printed document by reflection imaging (e.g., contact reflection imaging or optical projection imaging using reflected light). The reason for this is that the vast majority of printed documents are on papers containing optical brightening agents or $TiO_2$. These agents act as black dyes in an ultraviolet imaging system and absorb the ultraviolet radiation. Hence the background and image areas are both ultraviolet absorbers and there is no image discrimination by reflection imaging.

In making copies of printed documents, it has been found desirable to use a blue-light sensitive material. Using a blue-light sensitive material, it is possible to make the system handleable in room light by incorporating in the system a fugitive yellow filter dye which is bleached or otherwise rendered inactive or removed from the imaging system prior to exposure. The yellow dye absorbs blue-light and prevents an imaging material in accordance with invention from being exposed, for example, as it is removed from a light-shielded container and installed in an exposure apparatus. The fugitive dye may be incorporated in the imaging system in a separate layer which overcoats the layer of the encapsulated chromogenic and photosensitive materials or the fugitive dye may be fixed in the capsule wall of a discrete walled microcapsule. Yellow fugitive dyes are well known in the art. The preferred dyes are those which can be inactivated or removed from the imaging system with the greatest ease. Using these dyes, the imaging material is heated in the exposure apparatus to a temperature at which the dye is bleached prior to exposure. Thereafter, the imaging material can be exposed by the application of light in the visible blue range. In addition to thermally bleachable fugitive dyes, the invention is also open to the use of dyes which are bleached by oxidation. Although, using these dyes, a liquid processing step would normally be required to bleach the dye.

Room light handleability of visible light sensitive systems can also be achieved by adjusting the sensitivity of the photosensitive system such that a more intent exposure is required to activate the system.

An internal phase as described above can be encapsulated in a conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, and carboxymethylcellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) urea formaldehyde wall-formers and more particularly urea-resorcinol formaldehyde wall forms (in which oleophilicity is enhanced by the addition of resorcinol) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of these wall-forming materials, the above mentioned patents are specifically incorporated by reference. Microencapsulation has been accomplished by a variety of known techniques including coacervation, interfacial polymerization, polymerization of one or more monomers in an oil, as well as various melting, dispersing and cooling methods.

The capsule forming material used in a given imaging system is selected based on the photosensitive composition present in the encapsulate. Thus, the formed capsule wall must be transmissive of the exposure radiation. Of the above systems urea-resorcinol-formaldehyde and gelatin capsules are preferred.

The mean size of the capsules used in the present invention generally ranges from approximately 1 to 25 microns. As a general rule, image resolution improves as the capsule size decreases with the caveat that if the capsule size is too small, depending on the nature of the substrate on which the capsules are coated, the capsules may disappear in the pores or the fiber in the substrate, but even capsules as large as 25 microns provide satisfactory resolution in the present invention. In the latter case, the incongruities in the substrate may screen the capsules from exposure and thereby diminish image quality. They may also fail to rupture upon the application of pressure. In view of the foregoing, it has been found that a preferred means capsule size range is approximately 3 to 15 microns and particularly approximately 3 to 10 microns although, technically, the capsules can range in size up to the point that they are visible to the human eye.

Capsular coating compositions are prepared in a conventional manner in accordance with the present invention. Since the photosensitive encapsulate of the present invention is usually hydrophobic, the wall-forming constituents and the film forming binder should be hydrophilic and soluble in an aqueous based liquid as is conventional in forming capsule containing coating compositions. Otherwise, in certain known reverse systems the aqueous phase may be dispersed in a hydrophobic continuous phase. The microcapsules used in the present invention can be prepared by the methods disclosed in the aforementioned U.S. patents or by similar methods. For example, an oil solution of the internal phase comprising the chromogenic and photosensitive composition is dispersed in a continuous phase containing the wall-forming constituents, and microencapsulation is accomplished by, for example, coacervation or interfacial polymerization, among others. Open phase systems can be prepared by dispersing the internal phase in a solution of polymeric binder and adjusting the viscosity of the dispersion for coating. Among a wide variety of suitable binders are gelatin, polyvinyl alcohol, polyacrylamide, acrylic latices etc.

Coating compositions so formulated are applied and dried on a continuous web of paper. To prepare self-contained sheets, the developer material may be mixed with the coating composition and the mixture applied to the substrate web or pre-coated on the substrate as a separate contiguous layer. The practices used in U.S. Pat. No. 4,010,292 to prepare self-contained sheets are also useful in the present invention. Any ordinary coating or printing technique can be used in making imaging sheets in accordance with the invention including such means as roller or blade coating.

The coating compositions of this invention may contain any of the various additives known in the carbonless paper art to improve the handling characteristics of the coated copy sheet such as a stilt material (e.g., starch particles), silica particles to prevent specking when a pressure nip is used for capsule rupture, etc.

In its principal embodiment, the imaging system of the present invention is used to produce copies of printed documents, and, as such, the substrate upon which the coating composition is coated is paper. The paper may be a commercial impact raw stock, or a special grade paper such as cast-coated paper and chrome rolled paper. The latter examples are desirable when using very fine microcapsules, e.g., capsules ranging in size from approximately 1 to 5 microns, as the surface of these papers is smoother and the microcapsules are not as easily embedded in the stock fibers. Transparent substrates such as polyethylene terephthalate and translucent substrates can also be used in the invention.

The developer material used in the present invention is a compound or material capable of reacting with the chromogenic material to produce a color image. In the most typical case, the developer material is an electron accepting compound or a so-called color developer. In the broadest sense, however, the term "developer material" as used herein refers to that half of the color-forming reactants which is not encapsulated with the photosensitive composition. Hence, as stated before, compounds conventionally recognized as color developers can be encapsulated as the chromogenic material in the present invention, and compounds conventionally recognized as color formers can be used outside the capsule in the invention system.

The developer materials used in the present invention are those conventionally employed in carbonless paper technology and are well known. Illustrative specific examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble phenol-formaldehyde resin (as disclosed in U.S. Pat. No. 3,732,120), zinc carbonate, etc. and mixtures thereof. Again, to the extent necessary for complete disclosure of these materials, the above noted patents are specifically incorporated by reference. One developer commonly employed is a combination of kaolin and phenolic resin.

When used in a developer sheet for receiving an image from a transfer imaging sheet, the color developer may be mixed with a binder such as latex, polyvinyl alcohol, maleic anhydride-styrene copolymer, starch and gum arabic. It is to be understood that all binders well known as film-forming materials can be used in this capacity.

Self-contained copy sheets which are subjected to pressure to rupture the capsules preferably include a layer which prevents removal of the capsule coating as the self-contained sheet is passed through a pressure nip. Such a coating is referred to as a non-blocking layer and may be formed of any film-forming polymer which is transparent with respect to the exposure radiation. Representative examples of suitable non-blocking layer forming polymers are polyvinyl acetate, etc.

Imaging sheets embodying the invention imaging system can be exposed and developed using a fairly simple exposure apparatus. In its simplest form for reflection imaging, the apparatus requires only a radiation source, means of focusing the exposure radiation from the original onto the imaging sheet and means for rupturing the encapsulate. Simplified means such as this can be used with the invention because development is essentially a dry process with the developer and chromogenic material reacting in only the infintesimal droplets of solvent encapsulated in the internal phase. Furthermore, the chromogenic material and the developer are on the imaging sheet in the amounts (spacial density) required for imaging, hence, the invention obviates the elaborate means required in most prior photocopy systems for coating and metering the developing agent onto the imaging sheet in sufficient amounts.

The invention is illustrated in more detail by the following non-limiting examples:

EXAMPLE 1

Ultraviolet Photosensitive Microcapsule Preparation (UF Capsules)

To 25 parts of a filtered solution prepared by dissolution of 5.0 parts of gum arabic (Celanese; grade A-13, gum arabic special) in 50.0 parts of distilled water was added with stirring 26.9 parts of a 17.1% (total solids) solution of isobutylene/maleic anhydride copolymer and sodium hydroxide, prepared by addition of 5.44 parts of isobutylene/maleic anhydride copolymer (average molecular weight=$1.0 \times 10^6$) and 2 parts of sodium hydroxide in 32.5 parts of distilled water with stirring and heating to 92° C. for 2 hours. Subsequently 38.3 parts of distilled water was added and after heating to 60° C. the pH of the resulting mixture was adjusted to 4.0 (from an initial pH of 8.8) by the portionwise addition of 10% (V/V) aqueous sulfuric acid. With maintenance of the 60° C. temperature and constant stirring, 6.6 parts of urea and 0.8 parts of resorcinol were added and the pH of the mixture was readjusted to 4.0 with 10% (V/V) aqueous sulfuric as previously described. The completed solution, hereafter referred to as the aqueous phase, was maintained at 60° C. for immediate use.

Preparation of the internal phase, hereafter known as the organic phase, proceeded as follows: in a mixture of 40.0 parts of trimethylolpropane triacrylate (TMPTA) and 10.0 parts of methyl methacrylate (MMA) was dissolved with stirring and heating to 90° C., 3.0 parts of the color precursor, 3-diethylamino-6-methyl-7-anilinofluoran. While allowing the mixture to cool to 60° C., 2.5 parts of benzoin methyl ether and 1.0 parts of 4,4′-bis(dimethylamino) benzophenone were added and the mixture was allowed to stir until complete dissolution of these materials. The completed organic phase was maintained at 60° C. for immediate use.

Preparation of the urea-formaldehyde microcapsules proceeded as follows: to a commercial Waring blender equipped with a speed control consisting of a variable voltage power supply (variable autotransformer; 0 to 140 volt range) and preheated to 60° C. by means of a heated, forced air supply was added the entire aqueous phase. With the blender operating at 40 volts, the entire organic phase, also preheated to 60° C., was carefully added in a thin continuous stream. With provisions made for maintenance of the internal temperature at 60° C., the blender was operated at 90 volts for 45 seconds to effect emulsification. Directly after this 45 second period, the power supply setting was reduced to 40 volts, an aliquot was taken and the average particle size was determined by visual examination of the emulsion under a microscope. The average particle size was 4.5 microns.

Following this determination, 18.4 parts of a 37% (W/V) aqueous formaldehyde, preheated to 60° C., were added in one portion. After blending for 2 hours the mixture was transferred to a heatable container equipped with an efficient mechanical stirrer, the temperature was maintained at 60° C. and a solution of 0.6 parts of ammonium sulfate in 12.2 parts of water was added with high speed stirring. After 1.0 hours of stirring, the mechanical stirrer was removed, provision was made for magnetic stirring and the pH was adjusted to 9.0 (from an initial pH of 3.2) by the portion-wise addition of 10% (W/V) aqueous sodium hydroxide. Microcapsule preparation was completed by the addition of 2.8 parts of sodium bisulfite followed by an additional 10 minutes of stirring.

Preparation of Light Sensitive Sheets from the Above Microcapsule Preparation A slurry consisting of 10 parts of the above light sensitive microcapsule and 10 parts of distilled water was coated on 80 lb. black and white enamel paper stock using a #10 drawdown rod as the coating device and the coated papers were dried briefly in a circulated hot air oven at 95° C. The resulting dry sheets were immediately useable or could be stored for later use.

Preparation of Developer Sheet

To 218 parts of water were added with slow stirring 5.8 parts of a 50% aqueous suspension of styrene-butadiene latex, 40 parts of 10% aqueous 1.5% ethylated starch, 17 parts of hydrated silica gel, 21 parts of zinc carbonate, 13 parts of 47% aqueous sodium silicate, 1 part sodium hexa-meta-phosphate and 130 parts of Silton F-150 clay. After stirring at ambient temperature for 1 hour, the mixture was stabilized by the addition of 0.1 part of 37% aqueous formaldehyde and coated upon 80 lb. black and white enamel paper stock using a #10 drawdown bar as the coating device. The sheets were completed by brief drying in a recirculated hot air (95° C.) oven.

Reproduction of Images Using the Above Light Sensitive Sheets

The apparatus used in the reproduction of images using the light sensitive sheets consisted of: a near UV light source (2, 15 watt F-15T8-BLB black light bulbs), a positive photographic transparency, a plate glass cover plate and a calender stack capable of providing at least 30 lb. per lineal inch crushing pressure. Images were reproduced in the following way: a light sensitive sheet was positioned with light sensitive surface uppermost on a horizontal surface, the positive transparency was superimposed upon this sheet, followed by the glass cover plate and the assembly was irradiated for periods of 1, 2, 3 and 4 seconds by the above mentioned UV light source positioned parallel to and approximately 5 inches from the above assembly. Following exposure, the light sensitive sheet was placed against an image receiving and developing sheet prepared as above.

The sheets were positioned such that the active layers of each were in intimate contact and the assembled sheets were calendered. Such treatment and separation of the sheets resulted in the production of a reversed positive black image. Exposures of 1 and 2 seconds gave images of essentially similar quality, with good resolution and half-tone gradation. The 2 second exposure gave somewhat less transferred and developed dye background. Exposures of 3 and 4 seconds gave lower image intensity typical of over exposure.

EXAMPLE 2

Ultraviolet Photosensitive Microcapsule Preparation (UF Capsules)

An aqueous phase was prepared in exactly the same manner and proportions as described in Example #1.

Preparation of an organic phase proceeded as follows: to 50.0 parts of tetraethylene glycol diacrylate (TEGDA) was added with heating to 90° C. and stirring 3.0 parts of the same color precursor mentioned in Example 1. After complete dissolution of the dye precursor the mixture was allowed to cool to 60° C. and 2.5 parts of benzoin methyl ether and 1.0 parts of bis-4,4'-(dimethylamino) benzophenone were added successively and the mixture was stirred at 60° C. until complete dissolution occurred. The organic phase was maintained at 60° C. for immediate use.

The preparation of the urea-formaldehyde capsules proceeded exactly as described in Example 1, with the following important modification and observation: after careful addition of the organic phase to the aqueous phase in the blender, the blender was operated at 90 volts for 60 seconds instead of 45 seconds and the observed size of the emulsion droplets was, on the average, 5.0 microns instead of 4.5 microns. Capsule preparation was completed exactly as described in Example 1.

Preparation of Light Sensitive Sheets from the Above Microcapsule Preparation A slurry consisting of 10 parts of the above microcapsule preparation and 10 parts distilled water was coated on 80 lb. black and white enamel paper stock using a #10 drawdown rod as described in Example 1. Preparation of the light sensitive sheets was completed exactly as described previously and the resulting light sensitive sheets were immediately useable or could be stored for later use.

Reproduction of Images Using the Above Light Sensitive Sheets

The apparatus used for image reproduction was exactly the same as described in Example 1. Exposures of from 1 to 4 seconds resulted in no developed image, however; exposures of 1 and 2 minutes gave high quality black image reproduction after development by calendering against the same image receiving sheet as was used and described in Example 1.

EXAMPLE 3

Ultraviolet Photosensitive Microcapsule Preparation (UF Capsules)

An aqueous phase was prepared in exactly the same manner and proportions as described in Example #1. Preparation of an organic phase proceeded as follows:

To 50.0 parts of trimethylolpropane triacrylate was added with heating to 90°.C. and stirring 0.75 parts of the color precursor used in Example 1. After complete dissolution of the dye precursor the mixture was allowed to cool to 60° C. and 2.5 parts of benzoin methyl ether and 1.0 parts of bis-4,4'-(dimethylamino)benzophenone were added successively and the mixture was stirred at 60° C. until complete dissolution occurred. The organic phase was maintained at 60° for immediate use.

Preparation of the urea-formaldehyde microcapsules proceeded exactly as described in Example 1 with the following important modification and observation: after careful addition of the organic phase to the aqueous phase in the blender, the device was operated at 90 volts for 60 seconds instead of 45 seconds and the observed size of the emulsion droplets was, on the average 6.5 microns instead of 4.5 microns. Capsule preparation was completed exactly as described in Example 1.

Preparation of Light Sensitive Sheets from the Above Microcapsule Preparation Light sensitive self-contained sheets were prepared by drawdown coating (#22 drawdown rod) of a slurry consisting of 20 parts of the above capsule preparation, 5 parts of uncooked starch (Keestar 339) and 20 parts of distilled water on 80 lb. black and white enamel paper substrate previously coated with the following image developing layer: a slurry consisting of 35 parts of #2 kaolin coating clay, 2.94 parts of hydrated silica gel, 1.32 parts of 1.5% ethylated starch, 3.82 parts of styrene-butadiene latex, 5.88 parts of zincated novolak resin and 0.24 parts of sodium hexa-meta-phosphate in 50.8 parts of water was coated using a #22 drawdown rod.

Sheets were prepared as outlined above, and with one-half and one-quarter active capsule coat weights. Exposure of the various full, half and quarter strength sheets for periods ranging from 2 to 64 seconds gave variable quality images dependent directly upon the active coat weight. Thus, using one-quarter concentration sheets, 2 second exposure, as detailed in Example 1, gave good quality black images. On the one-half concentration sheets, 4 second exposures were required for good image quality, while the full strength sheets exposures of 32 seconds were required for good image reproduction.

EXAMPLE 4

Ultraviolet Photosensitive Microcapsule Preparation (UF Capsules)

An aqueous phase was prepared in exactly the same manner and proportions as described previously in Example #1. Preparation of an organic phase proceeded as follows:

To 50.0 parts of trimethylolpropane trimethacrylate (TMPTMA) was added with heating to 90° C. and stirring 3.0 parts of crystal violet lactone leuco dye and 5.0 parts of benzoin methyl ether. The mixture was stirred until complete dissolution and allowed to cool to 60° C. The organic phase was maintained at 60° C. for immediate use.

Preparation of the urea-formaldehyde capsules proceeded exactly as described in Example 1. After emulsification, the observed size of the emulsion droplets was, on the average, 6.0 microns. The microcapsule preparation was completed exactly as described in Example 1.

Preparation of Light Sensitive Sheets from the Above Microcapsule Preparation A slurry consisting of 10 parts of the above microcapsule preparation and 10 parts distilled water was coated upon impact rawstock paper previously coated (individually) with image developing layers. These developing layers consist in the one instance of solvent coated zincated novolak resin and in the other instance of aqueous coated and dried mixture of #2 kaolin coating clay, 1.3% ethylated starch, styrene-butadiene latex, zincated novolak resin and dispersants, including: sodium hexa-meta-phosphate, amino polyphosphonic acid and sodium polyelectrolyte carboxylate. A #12 drawdown bar was used as the coating device. The coated papers were dried by brief exposure to 95° C. air in a recirculated hot air oven and the resulting light sensitive sheets were immediately useable or stored for later use.

Reproduction of Images Using the Above Light Sensitive Sheets

The apparatus used for exposure of the light sensitive sheets was exactly the same as described in Example 1. Transmission contact exposures of a positive photographic transparency were made with exposure times of 16 and 32 seconds on samples of light sensitive microcapsules coated upon both of the previously mentioned developer layers. After exposure, the latent images were developed by hand calendering the sheets between a glass plate and a hard rubber roller, maintaining a contact force of at least 30 lb. per lineal inch. Development by such treatment of samples made using both types of image developer layers and for both exposure times gave essentially similar good quality blue image reproduction. Qualitatively, the longer exposure time gave slightly less background image development on both types of image developer layers and for both exposures times, the aqueous coated developer layer gave slightly greater developed dye image intensity.

Having described the invention, it is to be understood that the invention is not limited to this precise process and product, and that changes may be made therein without departing from the scope of the invention which is defined in the appended claims.

What is claimed is:

1. An imaging process which comprises:
   image-wise exposing to actinic radiation a coating comprising a substantially colorless chromogenic material and rupturable capsules containing a photosensitive composition which undergoes a change in viscosity in areas in which it has been exposed to actinic radiation, and
   subjecting said capsules to a uniform rupturing force in the presence of a developer material such that there is a patterned reaction between said chromogenic material and said developer which produces a positive or negative image corresponding to said exposure.

2. The process of claim 1 wherein said image-wise exposure is by reflection imaging.

3. The process of claim 1 wherein said image-wise exposure is by transmission imaging.

4. The process of claim 1 wherein said pressure rupturable capsules are microcapsules having a discrete capsule wall.

5. The process of claim 4 wherein said photosensitive composition comprises a radiation curable material and said image is a positive image.

6. The process of claim 5 wherein said photosensitive composition comprises a ethylenically unsaturated compound material and a photoinitiator.

7. The process of claim 4 wherein said photosensitive composition is sensitive to visible, ultra-violet, infrared, X-ray, or electron beam radiation.

8. The process of claim 4 wherein said photosensitive composition is sensitive to ultra-violet radiation.

9. The process of claim 4 wherein said photosensitive composition is sensitive to light having a wave-length in the range from 380 to 480 nm.

10. The process of claim 1 wherein said developer is present in said coating interdispersed with said pressure rupturable capsules.

11. The process of claim 1 wherein said coating is temporarily shielded using a fugitive dye and said process additionally comprises the initial step of bleaching said fugitive dye.

12. The process of claim 6 wherein said chromogenic material is an electron donating dye precursor and said developer is an electron accepting compound.

13. The process of claim 12 wherein said dye precursor is present in said internal phase.

14. The process of claim 13 wherein said radiation curable composition includes a polyethylenically unsaturated compound.

15. The process of claim 13 wherein said patterned reaction occurs in the absence of any externally applied wet developing agent.

16. The process of claim 1 wherein said patterned reaction occurs in the absence of any externally applied wet developing agent.

17. The process of claim 1 wherein said developer is present in a layer underlying said coating comprising said

* * * * *

UNITED STATES PATENT AND TRADEMARK OFFICE
CERTIFICATE OF CORRECTION

PATENT NO. : 4,842,981
DATED : June 27, 1989
INVENTOR(S) : Frederick W. Sanders

It is certified that error appears in the above-identified patent and that said Letters Patent is hereby corrected as shown below:

On the title page, item [75], should read as follows:

--Inventor: Frederick W. Sanders, Chillicothe, Ohio--.

Signed and Sealed this

Twelfth Day of November, 1991

Attest:

HARRY F. MANBECK, JR.

Attesting Officer

Commissioner of Patents and Trademarks